United States Patent [19]

Sasaki et al.

[11] Patent Number: 5,396,361
[45] Date of Patent: Mar. 7, 1995

[54] FREQUENCY SEPARATION STABILIZATION METHOD FOR OPTICAL HETERODYNE OR OPTICAL HOMODYNE COMMUNICATION

[75] Inventors: Shinya Sasaki, Kodaira; Hideaki Tsushima, Hachioji; Minoru Maeda, Nishitama, all of Japan

[73] Assignee: Hitachi, Ltd., Tokyo, Japan

[21] Appl. No.: 902,473

[22] Filed: Jun. 19, 1992

Related U.S. Application Data

[63] Continuation of Ser. No. 818,503, Jan. 8, 1992, abandoned, which is a continuation of Ser. No. 385,307, Jul. 25, 1989, abandoned.

[30] Foreign Application Priority Data

Jul. 29, 1988 [JP] Japan ................... 63-188413

[51] Int. Cl.$^6$ ............. H04B 10/00; H04B 10/06; H04J 14/02
[52] U.S. Cl. ........................ 359/189; 359/124; 359/156; 359/161; 359/190; 359/191; 359/192; 359/194
[58] Field of Search ............. 359/124, 127, 130–131, 359/140, 156, 161–162, 173, 187–195

[56] References Cited

U.S. PATENT DOCUMENTS

| | | | |
|---|---|---|---|
| 4,726,011 | 2/1988 | Ih et al. ...................... | 370/3 |
| 4,732,447 | 3/1988 | Wright et al. .................. | 359/195 |
| 4,783,852 | 11/1988 | Auracher ..................... | 359/194 |
| 4,839,614 | 6/1989 | Hill et al. ..................... | 370/3 |
| 4,888,817 | 12/1989 | Ryu et al. ..................... | 359/192 |
| 4,965,858 | 10/1990 | Naito et al. ................... | 359/192 |

FOREIGN PATENT DOCUMENTS 0235919 9/1987 European Pat. Off. ............ 455/618

OTHER PUBLICATIONS

Glanee, B., et al., Densely-Spaced FDM Coherent Star Network With Optical Signals Frequency-Locked To A Comb Of Equally-Spaced Frequencies, IEEE © 1988.

European Conference on Optical Communication, Sep. 21, 1982, pp. 174–178; Steele et al., Electronic Controll of a Difference Frequency Between Two Semiconductor Lasers.

Applied Physics B, vol. B 35, No. 7, Nov./1984, pp. 119-122, Whitford, Simultaneous Phase-Lock of Five $CO_2$ Lasers to a Primary Cs Frequency Standard.

Mollenauer, White; Tunable Lasers (Topics in Applied Physics vol. 59), 1987 p. 13, paragraph B.

Journal of Optical Communication, vol. 2, No. 3, Sep./1981, pp. 82–88, Okoshi, Kimura; Heterodyne–Type Optical Communication.

*Primary Examiner*—Herbert Goldstein
*Assistant Examiner*—K. Negash
*Attorney, Agent, or Firm*—Fay, Sharpe, Beall, Fagan, Minnich & McKee

[57] ABSTRACT

A system for stabilizing a frequency separation between two coherent light sources includes first and second current sources driving first and second semiconductor laser devices with first and second frequencies, respectively. Light from the semiconductor laser devices is combined in a multiplexer, and a portion the combined light is diverted to an optical-to-electrical transducer. Output current from the transducer is combined with an output of a local oscillator driven at a selected frequency. A combined signal is then filtered, and used to form a control signal of one of the semiconductor laser devices.

16 Claims, 12 Drawing Sheets

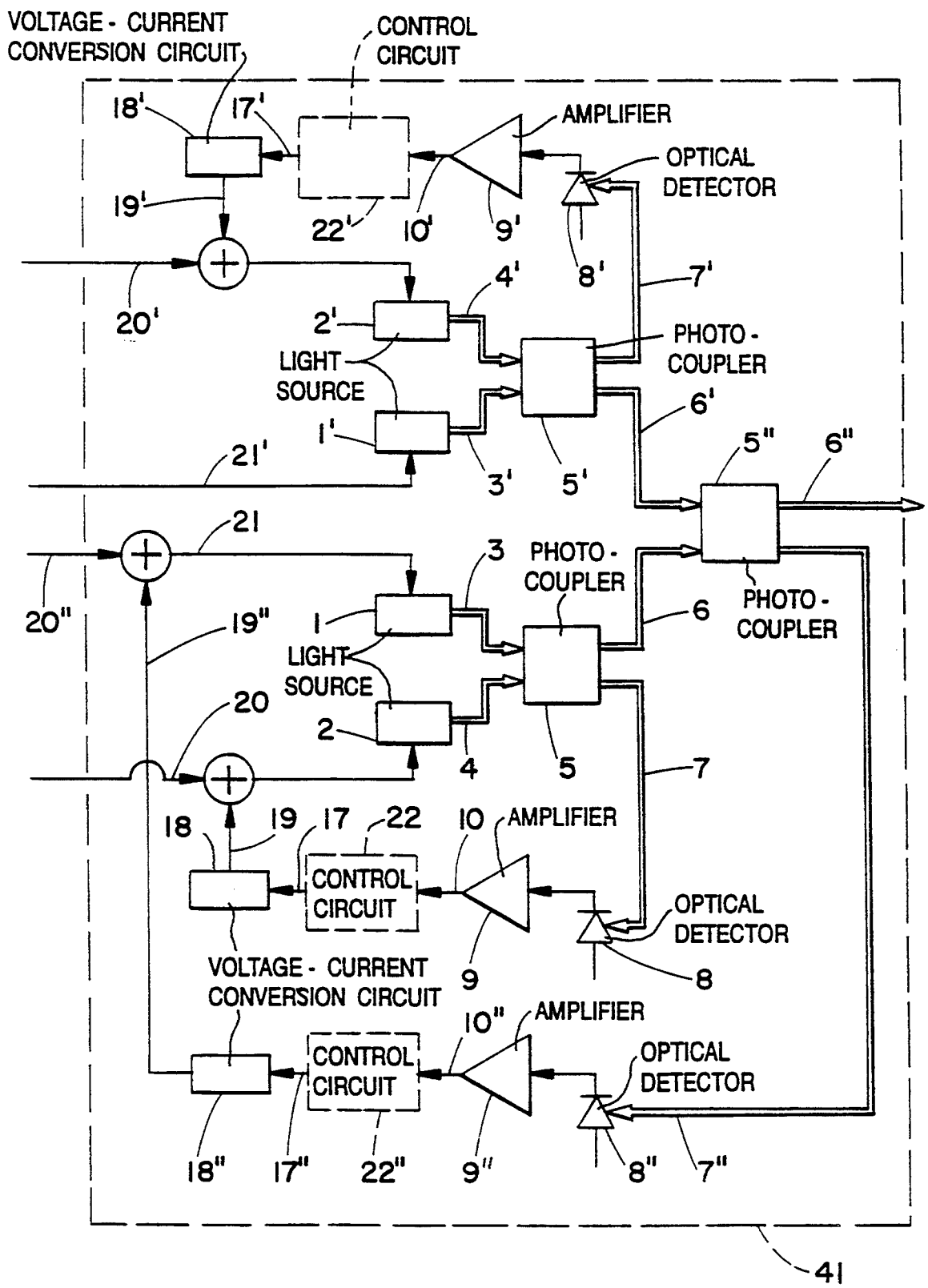
F I G. 10

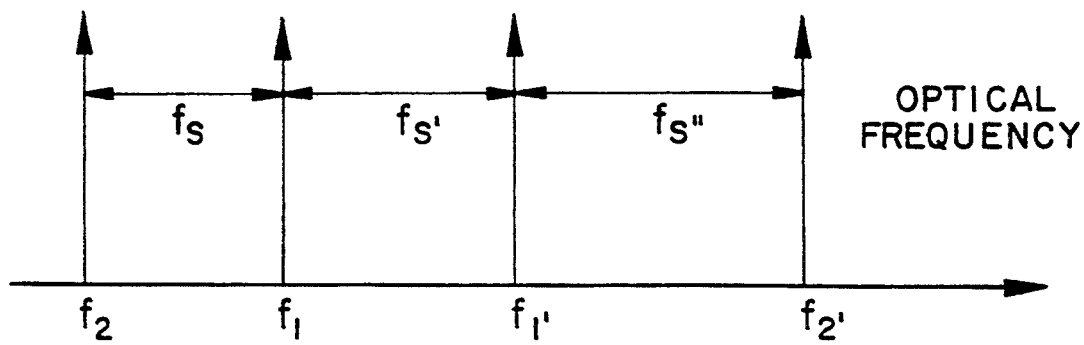
F I G. 14
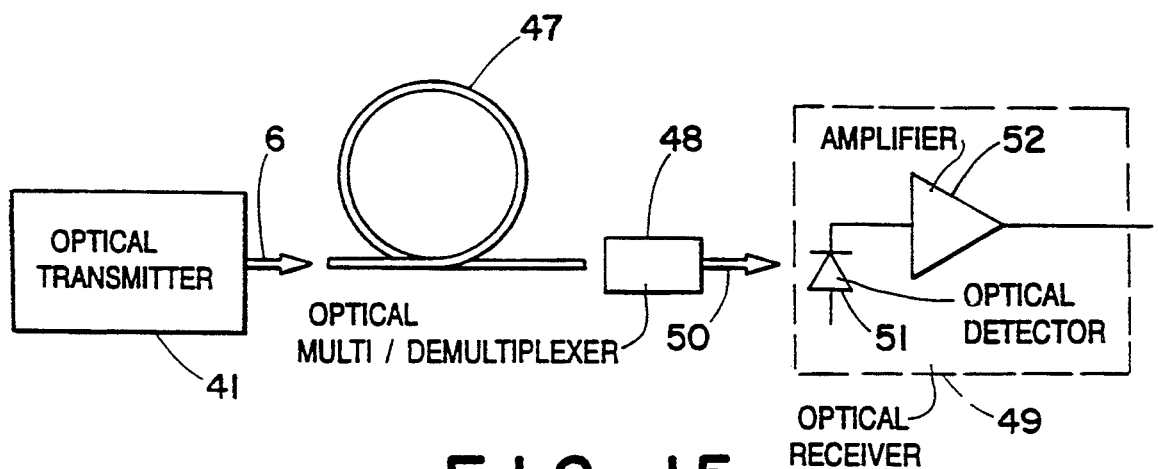
F I G. 15
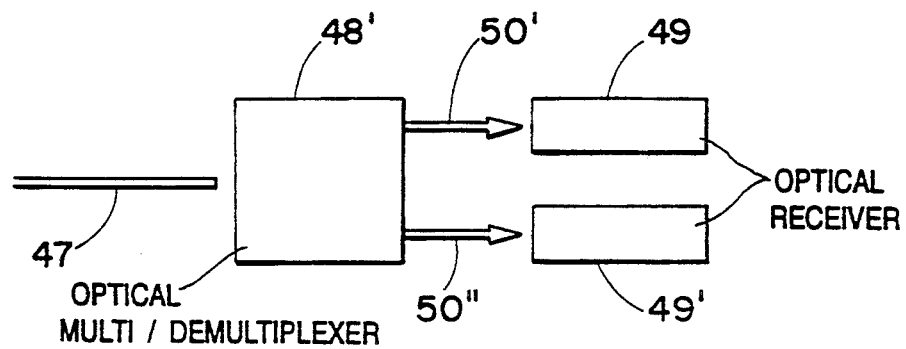
F I G. 16

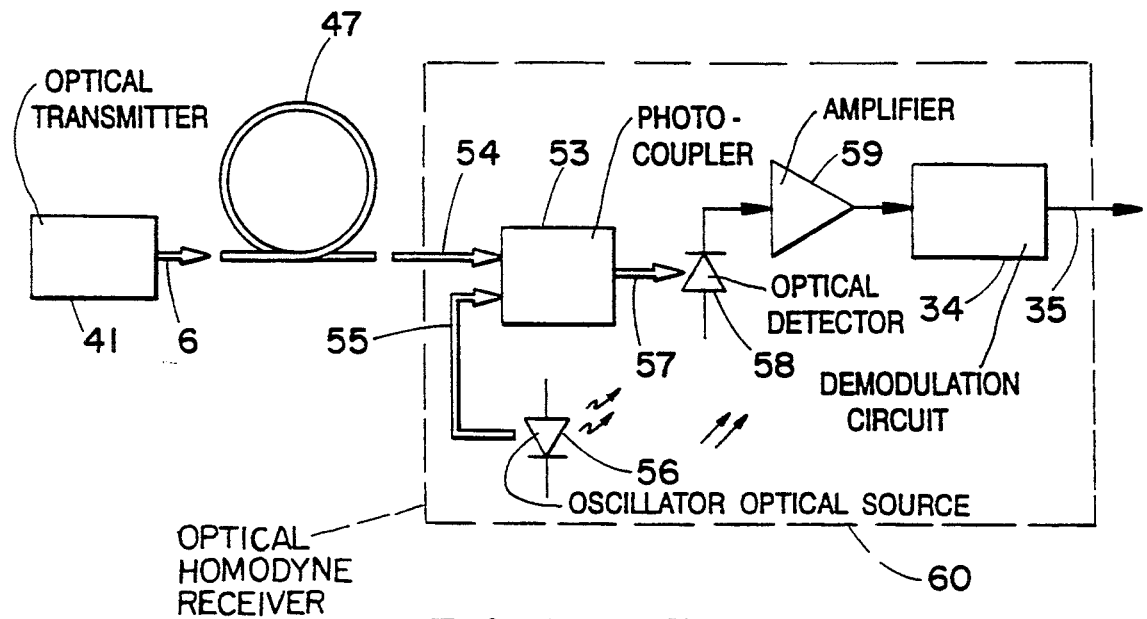
F I G. 17
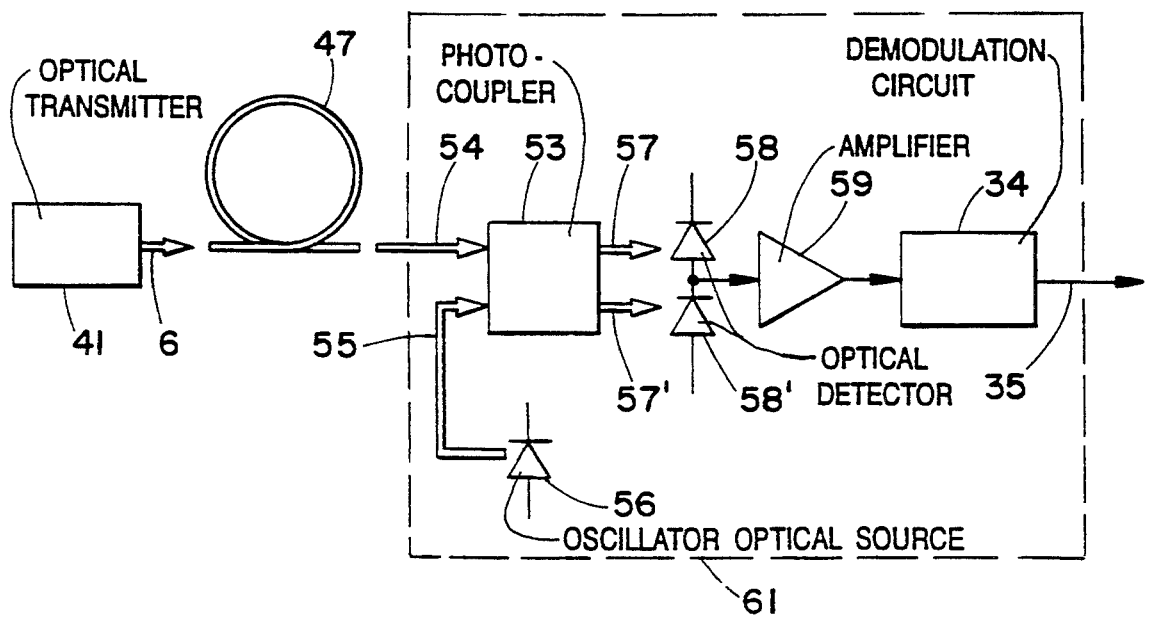
F I G. 18

FREQUENCY SEPARATION STABILIZATION METHOD FOR OPTICAL HETERODYNE OR OPTICAL HOMODYNE COMMUNICATION

This is a file-wrapper continuation of application Ser. No. 07/818,503, now abandoned filed on Jan. 8, 1992, which in turn is a file-wrapper continuation of Ser. No. 07/385,307, now abandoned filed on Jul. 25, 1989.

BACKGROUND OF THE INVENTION

This invention relates generally to optical communication systems, and more particularly to systems for stabilizing wavelength or frequency separation of light sources to render them suitable for a wavelength multiplexing or frequency multiplexing systems in coherent optical communication or direct detection optical communication systems.

A conventional wavelength or frequency separation stabilization systems for light sources is discussed in IEEE, International Conference on Communications, Conference Record 37.4.1, pp. 1219–1223 (1988). This paper is directed to fiber type Fabry-Perot resonators, or in other words, a kind of etalon, as a means for stabilizing frequency separation. This etalon is used as an optical frequency discriminator for converting an optical frequency to an intensity. The system stabilizes the optical frequency separation by detecting the change of the intensity of the output beam of the etalon that occurs when the optical frequency changes, and by using this signal as a control signal.

In accordance with the technique described above, frequency stability of the light sources is limited by stability of the etalon with respect to the changes in temperature, mechanical vibration, air pressure, and the like. It is therefore difficult to maintain stability for extended periods.

A system is therefore desirable which can facilitate a frequency separation stabilization which is stable for extended periods of time.

Wavelength division multiplexing or frequency division multiplexing optical communication systems using the above-described technique render another problem in that part of a photo-coupler output for combining the beams from a plurality of light sources is discarded without using it. The optical output is not, therefore, utilized effectively.

It is also therefore desirable that a system be provided which can accomplish wavelength division multiplexing or frequency division multiplexing optical communication which utilizes effectively optical outputs of light sources.

SUMMARY OF THE INVENTION

In accordance with the present invention, output beams of two light sources are combined and a portion of the combined beam is subjected to optical heterodyne detection by an optical detector and converted to an electric signal. This electric signal and the output of an oscillator are multiplied, and a difference frequency component generated by this multiplication between the electric signal and the output of the oscillator is extracted. The change of this signal component is detected by a frequency discrimination circuit and this signal is applied to one or both of the semiconductor lasers so as to make the difference of the optical frequencies of the two semiconductor lasers constant.

BRIEF DESCRIPTION OF THE DRAWINGS

The invention will be described in conjunction with the following Figures which form a part hereof and wherein:

FIG. 10 shows a ninth embodiment of the subject system;

FIG. 14 shows a disposition of the frequency of beams from the light sources on the optical frequency axis in the twelfth embodiment;

FIG. 15 shows a structure of a fourteenth embodiment of the subject system;

FIG. 16 shows another structure of the fourteenth embodiment;

FIG. 17 shows a fifteenth embodiment of the subject system;

FIG. 18 shows a sixteenth embodiment of the subject system;

DETAILED DESCRIPTION OF THE PREFERRED AND ALTERNATE EMBODIMENTS

Figure 1:
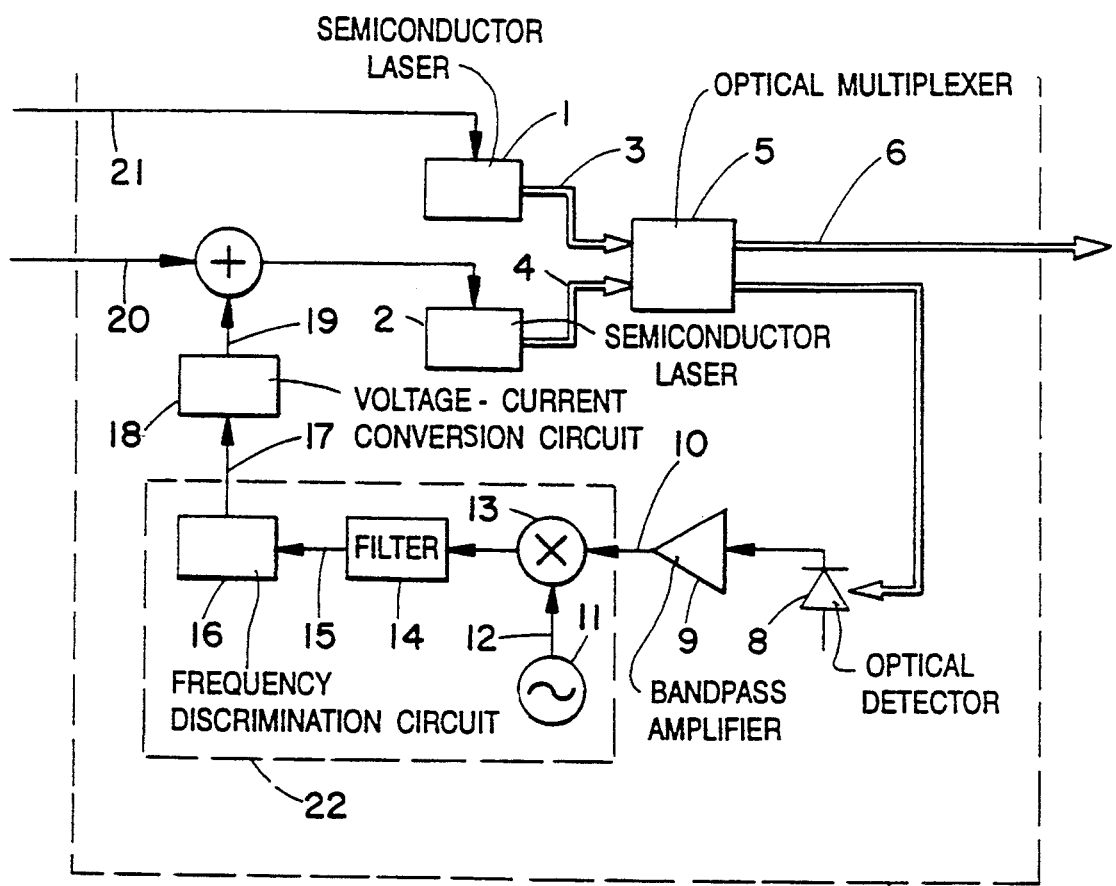
FIG. 1 shows A first embodiment of the present invention.

The principle embodiment of the present invention will be described with reference to FIG. 1. A semiconductor laser suitably forms light sources 1 and 2.

The output beams 3 and 4 of two semiconductor lasers 1 and 2 are combined by an optical multiplexer 5, such as a photo-coupler, and part of the beam 7 of the output is converted to an electric signal by an optical detector 8. At this time, an electric signal of a difference frequency $f_2-f_1$ component between the optical frequency $f_1$ and $f_2$ (it is hereby assumed that $f_2>f_1$) of the output beams of the two semiconductor lasers occurs. This signal component and the output 12 of an oscillator 11 are multiplied by a multiplier 13. At this time the frequency of the oscillator output 12 is set to $f_s-f_o$, for example. Here, $f_s$ represents a desired optical frequency separation of the two semiconductor lasers. Then, a signal having a frequency component $f_2-f_1-f_s+f_o$ appears at the output of the multiplier 13. The output of a filter 14 permitting the passage of this signal component is applied to a frequency discrimination circuit 16 having a certain specific voltage, e.g. a 0 V output, when the input frequency is $f_o$. Then, the output of this circuit becomes a signal corresponding to the frequency $f_2-f_1-f_s$. It is possible to establish the relation $f_2-f_1=f_s$ by applying this signal to the semiconductor laser.

In FIG. 1, the output signal 17 of the frequency discrimination circuit is superimposed with a driving current 20 of the light source 2 to attain this relationship. In this manner, the frequency separation between the two light sources can be kept at the constant value $f_s$.

In accordance with the present invention, the stability of the frequency separation between the two light sources is determined by the oscillator and the frequency discrimination circuit. This stability is sufficiently higher than stability of optical components, such as etalon, and a stable frequency separation stabilization system can thus be accomplished.

In accordance with the present invention, frequency separation stabilization is conducted by use of part of the output of the optical multiplexer, and an optical wavelength multiplexing or frequency multiplexing communication system is realized by utilizing effectively the optical output, which output has not been used conventionally.

In optical wavelength multiplexing, or frequency multiplexing communication, it is necessary to keep constant the optical frequency separation between the light sources in order to stably secure transmission quality. Considering the case where semiconductor lasers are used for the light sources, the difference $f_2-f_1$ between the optical frequency $f_1$ and $f_2$ (on the premise that $f_2>f_1$) of the two semiconductor lasers 1 and 2 is kept at an arbitrary frequency $f_s$. In ordinary wavelength multiplexing or frequency multiplexing communication, the output beams 3 and 4 of the two light sources described above are combined by an optical multiplexer 5, such as a photo-coupler, and part of the output beam is used as a transmission signal. Here, part 7 of the output beam of the optical multiplexer 5 is converted to an electric signal by an optical detector 8 such as a p-i-n photo-diode or APD (Avalanche Photo Diode). This electric signal contains a frequency component $f_2-f_1$.

The signal is then amplified by a bandpass amplifier 9 which permits the passage of $f_2-f_1$. In this case, the amplifier 9 may consist of the combination of a low-pass amplifier with a bandpass filter or a high-pass filter. The output signal 10 of this amplifier 9 and the output 12 of an oscillator 11 are multiplied by a multiplier 13. A double balance mixer is an example of this multiplier 13. The output 12 of this oscillator 11 is set to $f_s-f_o$. Here, $f_s$ represents a desired optical frequency separation between the two semiconductor lasers. Then, the frequency of the output of the multiplier 13 becomes $|(f_2-f_1)\pm(f_s-f_o)|$. Among them, the low frequency component $|(f_2-f_1)-(f_s-f_o)|$ is taken out by the low-pass or bandpass filter 14. This signal 15 is applied to a frequency discrimination circuit 16. This frequency discrimination circuit 16 is set so that when the frequency of the input signal is $f_o$, its output takes a certain predetermined value, e.g. 0 V, and when the frequency of the input signal is higher than $f_o$ or lower than $f_o$, a positive or negative signal is outputted, respectively.

Figure 2:
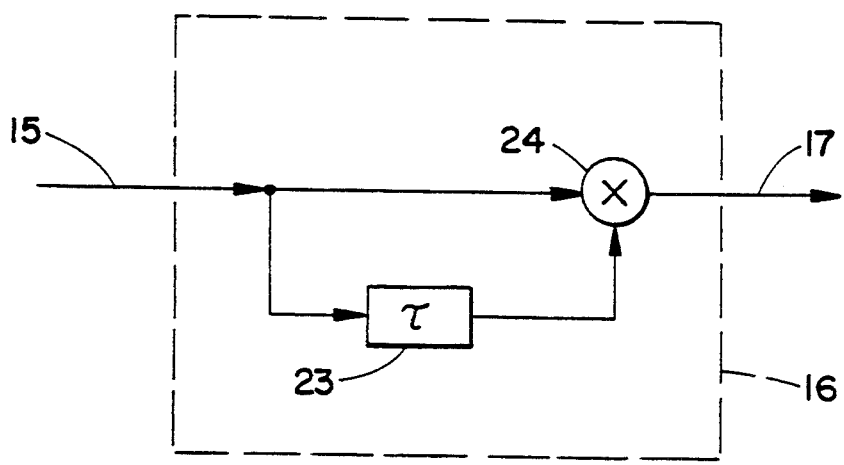
FIG. 2 shows construction of a frequency discrimination circuit of FIG. 1.

This frequency discrimination circuit is suitably comprised of a signal separation circuit (divider), a delay circuit 23 and a double balance mixer 24 as shown in FIG. 2. At this time the delay time of the delay circuit 23 can be expressed substantially as follows:

$$\tau=(n+\tfrac{1}{2})/(2f_o) \qquad (1)$$

where n is an odd number.

Figure 3A:
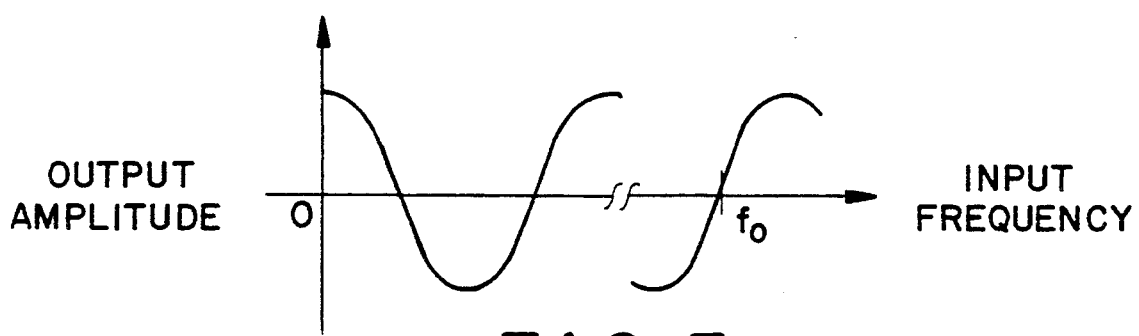
FIGS. 3a–3b illustrate frequency discrimination characteristics of the frequency discrimination circuit of FIG. 2.
Figure 3B:
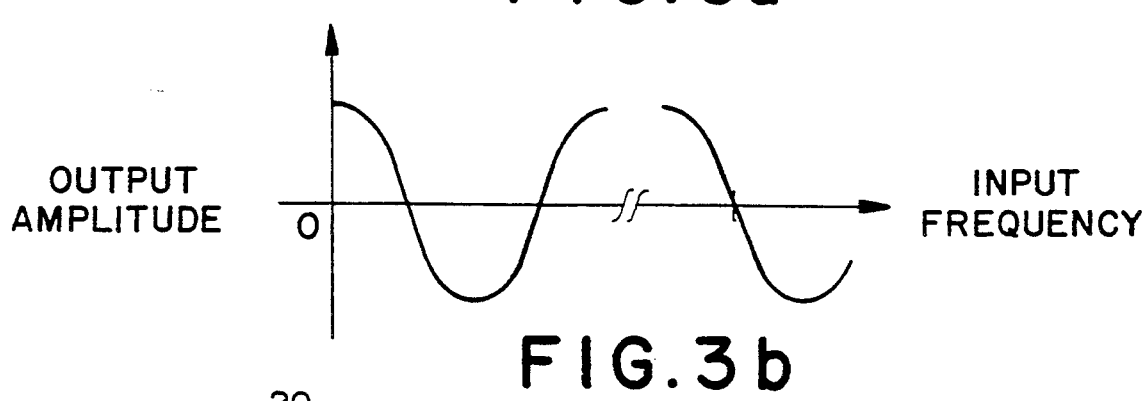

Then, the input/output characteristics of this frequency discriminator is as shown in FIG. 3$<a>$ and which exhibits desired characteristics. If the output is V and the input frequency is f, $V\alpha \cos(2\pi f\tau)$. The output signal (voltage) 17 of this frequency discrimination circuit is applied to a voltage current conversion circuit 18 to obtain a current signal 19. This signal current 19 is added to a driving current 20 of the semiconductor laser 2. In such a construction, the optical frequency $f_2$ of the semiconductor laser 2 is controlled by the current so as to satisfy the relation $f_2-f_1=f_s$. It will be assumed, for example, that the optical frequency $f_1$ of the semiconductor laser 1 becomes high for some reason (change of temperature, current 20, etc.) and $f_2-f_1<f_s$. Then, the frequency $|(f_2-f_1)-(f_s-f_o)|$ of the input signal 15 to the frequency discrimination circuit 16 becomes smaller than $f_o$ and the output voltage 17 from the frequency discrimination circuit 16 generates a negative voltage. The voltage-current conversion circuit 18 then generates a current 19 corresponding to the signal 17, which is added to the driving current 20 to raise the optical frequency $f_2$ of the semiconductor laser 2. (In practice, the current 19 in this case is a negative current and makes the driving current 20 small and $f_2$ high.) When $f_2-f_1=f_s$ in this manner, the frequency component $|(f_2-f_1)-(f_s-f_o)|$ of the signal 15 becomes $f_o$ and the output voltage 17 of the frequency discrimination circuit becomes 0 V. The optical frequency difference $f_2-f_1$ between the two semiconductor lasers 1 and 2 is kept at $f_s$.

The same discussion as described above will now be made about the case of $f_1>f_2$. In this case, $f_1-f_2$ must be kept at the predetermined value $f_s$. The low frequency component 15 of the multiplier 13 becomes $|(f_1-f_2)-(f_2-f_o)|$. Therefore, when the signal is added to the driving current 20 of the semiconductor laser 2 in the same way as in the above-mentioned case ($f_2>f_1$), the frequency difference $f_1-f_2$ deviates from $f_s$. When, for example, $f_1$ becomes high, $f_1-f_2-f_s>0$ and the output 17 of the frequency discrimination circuit 16 generates a positive voltage so that the optical frequency $f_2$ of the semiconductor laser 2 becomes low. Accordingly, $f_1-f_2$ becomes all the more greater and comes away from $f_s$. In this case, $f_1-f_2$ can be set to the predetermined value $f_s$ by employing any one of the following four methods.

(1) The signal current 19 is added to the driving current 21 of the semiconductor laser 1, but not to the driving current 20 of the semiconductor laser 2.

(2) The frequency of the output signal 12 of the oscillator 11 is set to $f_s+f_o$.

(3) The polarity of the output of the frequency discrimination circuit is inverted. In other words, a negative signal is outputted when the input frequency is higher than $f_o$ and a positive signal is outputted when it is lower than $f_o$. This can be accomplished by setting the delay time $\tau$ of the delay circuit 23 in the frequency discrimination circuit 16 of FIG. 2, for example, so as to satisfy substantially the following equation:

$$\tau = (n + \tfrac{1}{2})/(2f_o) \qquad (2)$$

where n is an even number.

The input/output characteristics of the frequency discrimination circuit 16 at this time are such as shown in FIG. 3<b>.

(4) The polarity of the voltage-current conversion circuit 18 is inverted. In other words, a negative current is outputted (current suction) when the input voltage is positive and a positive current is outputted when the input voltage is negative.

Incidentally, this embodiment can be applied similarly to a multi-electrode semiconductor laser. In this case, the signal current 19 may be applied directly to one or a plurality of electrodes of the multi-electrode laser.

Since this embodiment is the system which applies negative feedback to the driving current, the embodiment can accomplish a frequency separation stabilization system which provides a quick frequency response of the feedback system and can follow a sharp optical frequency change.

Next, the second embodiment will be described with reference to FIG. 4. As light sources 1 and 2, this embodiment uses a combination of a semiconductor laser 25, an optical system 26, and a mirror 27 shown in FIG. 4<a>; the combination of the semiconductor laser 25 and an optical fiber 28 shown in FIG. 4<b>; or the combination of the semiconductor laser 25, an optical system 26 and a diffraction grating 29 shown in FIG. 4<c>. At this time the driving current 20 on which the control current 19 is superposed is applied to the semiconductor laser 25. This embodiment provides the effect that a light source having a narrow spectral line width can be obtained.

The third embodiment will be explained with reference to FIG. 4. Though this embodiment uses the combination of the semiconductor laser 25 and the external mirror or the optical fiber or the diffraction grating in the same way as in the second embodiment, this embodiment stabilizes the frequency separation by changing the length 1 between the semiconductor laser 25 and the mirror 27 or the optical fiber 28 or the diffraction grating 29 of the light source so as to change the optical frequency. In the optical source using the diffraction grating, the optical frequency is changed by changing the angle Θ as the optical axis by the diffraction grating by use of the output signal so as to stabilize the frequency separation. The distance 1 or the angle Θ can be changed by driving the mirror 27, the optical fiber 28, or the diffraction grating 29 by a piezo device. The optical frequency is changed by applying the output signal 17 of the control circuit 22 of FIG. 1 to the driving circuit of the piezo device so that frequency separation can be stabilized. In this embodiment, there can be obtained the light source having a narrow spectral line width.

Figure 5:
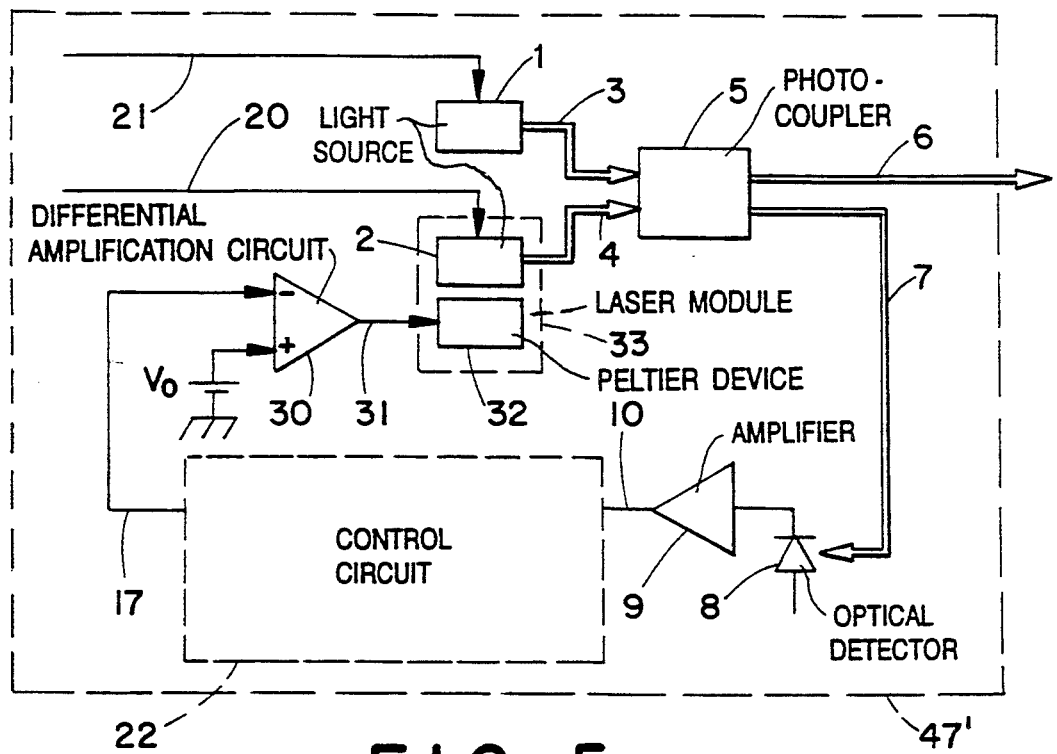
FIG. 5 shows a fourth embodiment of the present invention.

The fourth embodiment will be explained with reference to FIG. 5. The output voltage 17 of the control circuit 22 is compared with a reference voltage ($V_o$ in FIG. 5) by a differential amplification circuit 30. Its difference signal 31 is applied to a variable temperature device such as a Peltier device 32 of the light source 2 in order to change the temperature of the light source 2, to change the optical frequency $f_2$ (generally, the optical frequency drops in semiconductor lasers when the temperature is raised), and to fix the frequency separation $f_2 - f_1$ to the set value $f_s$. If the output characteristics of the frequency discrimination circuit 15 are set to 0 V when the frequency of its input signal is $f_o$, the reference voltage Vo of the (+) input terminal of the differential amplification circuit 25 is of course set to 0 V. Incidentally, a laser module 33 incorporating therein integrally the light source 2 and the Peltier device 32 in a casing is hereby used.

Since negative feedback is applied to the Peltier device to change the temperature, this embodiment provides the effect that the breakdown of the device is eliminated due to the drastic change of the driving current of the light source 2 by the control signal. Since the optical frequency has frequency-temperature characteristics of −12 GHz/° C. in the semiconductor laser, there can be obtained the effect that the optical frequency can be controlled easily by frequency-current characteristics (−1 GHz/mA).

Figure 6:
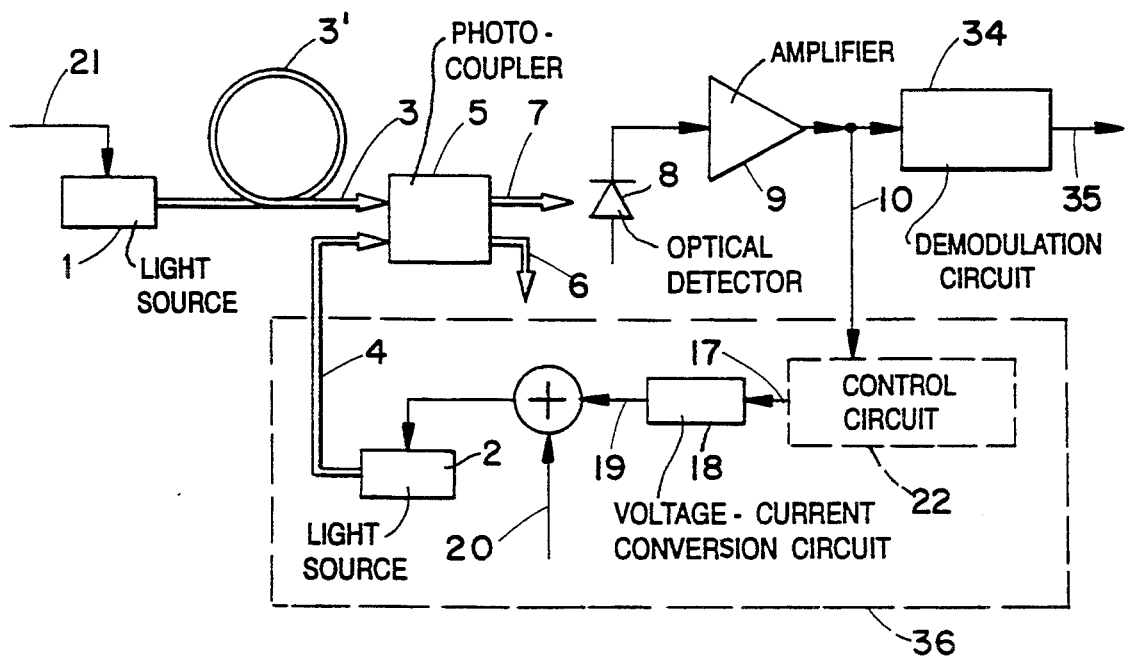
FIG. 6 shows a fifth embodiment of the subject system.

The fifth embodiment of the present invention will be explained with reference to FIG. 6. The light sources 1 and 2 are herein assumed to be semiconductor lasers. The optical signal of the light source 1 driven by the driving current 21 passes through the optical fiber as the optical transmission path 3' and is combined with the output beam 4 of the local oscillation light source 2 by the photo-coupler 5. The output 7 of this photo-coupler 5 is converted to the electric signal by the optical detector 8. The frequency component $f_2 - f_1$ (where $f_1$ and $f_2$ are optical frequency of the lasers 1 and 2, respectively, and assumed to be $f_2 > f_1$) of this signal is amplified by the amplifier 9 and its part is converted to the baseband signal 35 by the demodulation circuit 34. Part 10 of the output of the amplifier 9 passes through the control circuit 22 and is converted to the control signal 17. As the control current 19 is applied to the current 20 of the local oscillation light source 2, the optical frequency $f_2$ of the local oscillation semiconductor laser 2 operates in such a manner as to satisfy the relation $f_2 - f_1 = f_s$. This embodiment stabilizes the intermediate frequency $f_2 - f_1$ in the optical heterodyne communication system. If $f_s = 0$ in this embodiment, the system becomes an optical homodyne communication system.

This embodiment provides the effect that the intermediate frequency can be stabilized and the optical heterodyne communication system and the optical homodyne communication system can be accomplished while keeping stable transmission quality.

Figure 4A:
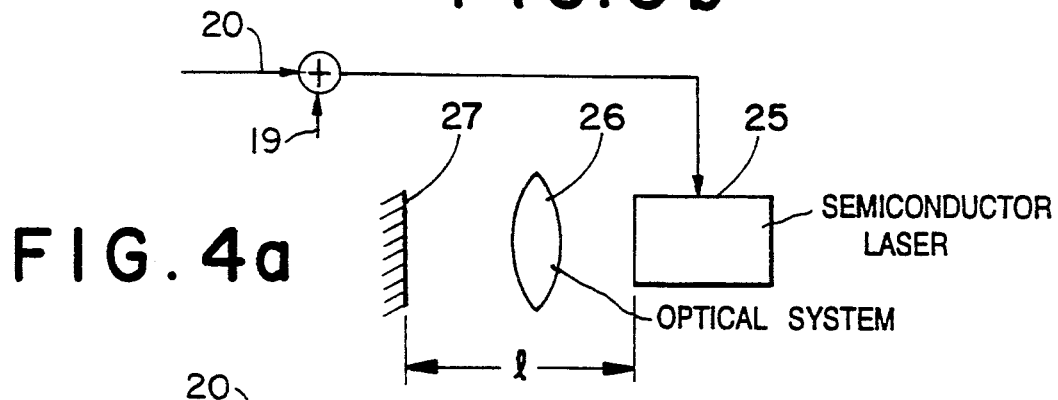
FIGS. 4a–4c are a structural view of the light sources of the second and third embodiments of the present invention.
Figure 4B:
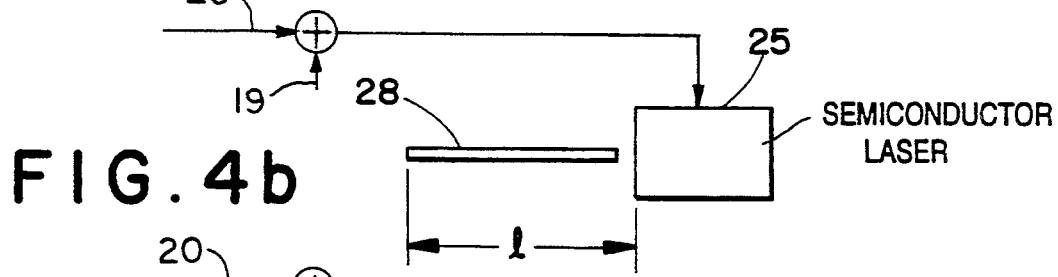
Figure 4C:
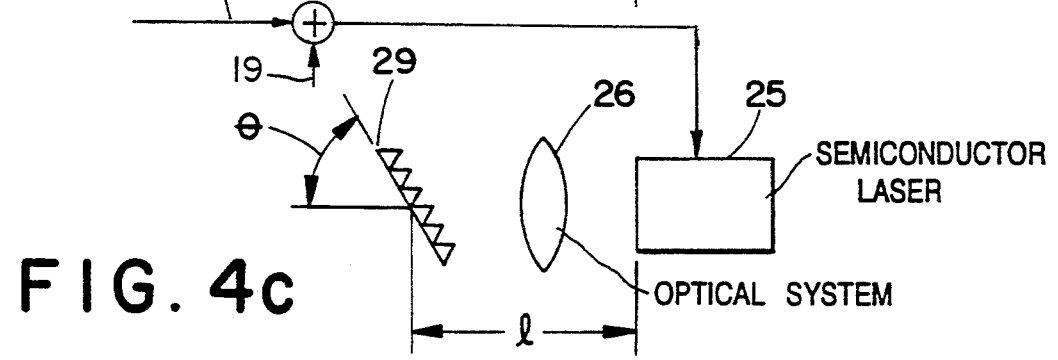

In this embodiment, it is possible to use, as the light sources 1 and 2, other lasers; semiconductor lasers having a plurality of electrodes; and a combination of semiconductor lasers, the optical system and the mirror; optical fibers; or diffraction grating shown in FIG. 4. Needless to say, the method of FIG. 5 which changes the temperature of the local oscillation light source 2 by use of the control signal 17 can be applied to this embodiment. When the light sources shown in FIG. 4, are used, the intermediate frequency can of course be stabilized by changing the distance 1 between the semiconductor laser 25 (which serves as the local oscillator light source) and the mirror 27 or the optical fiber 28 or the diffraction grating, or changing the angle Θ in the case of the diffraction grating by use of the control signal 17.

Figure 7:
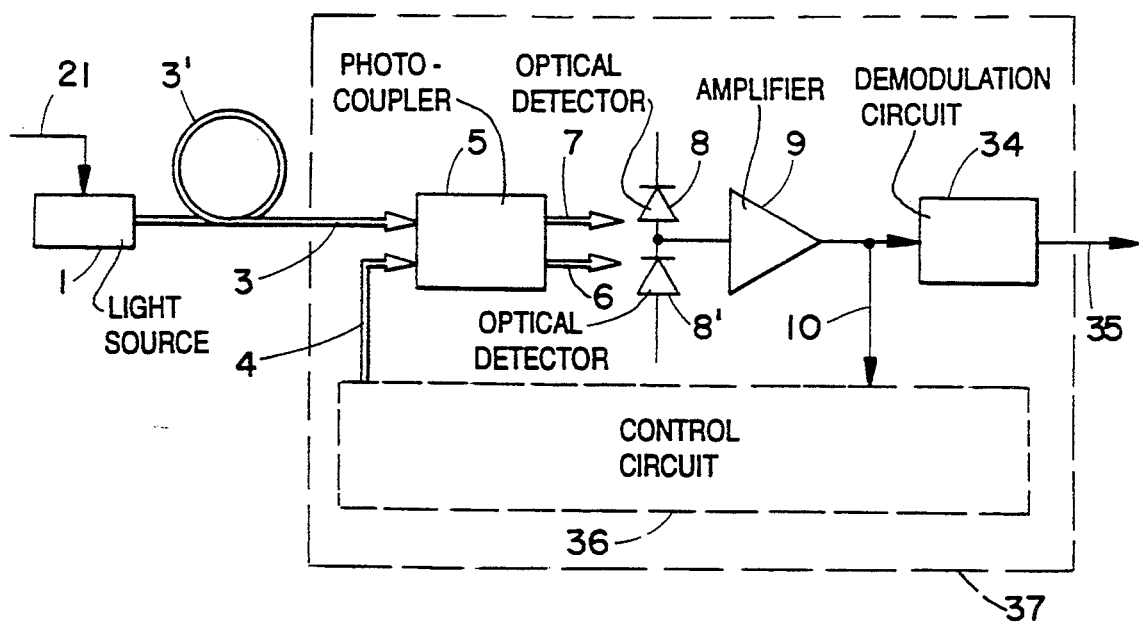
FIG. 7 shows a sixth embodiment of the subject system.

The sixth embodiment will be explained with reference to FIG. 7. FIG. 7 is a structural view of an optical heterodyne or optical homodyne system using a balanced type optical receiver. The optical signal 3 transmitted is combined with a local oscillation beam 4 by a 3 dB photo-coupler 5 and after their power is halved, they are outputted as the combined beams 7 and 6. These beams 7 and 6 are incident to optical detectors 8 and 8', respectively, are converted to electric signals and subtracted each other to provide one electric signal. Part 10 of this signal is inputted to a control circuit 36 to stabilize the intermediate frequency and the rest are inputted to the demodulation circuit 34 to output a demodulation signal 35.

Since the intensity noise of the local oscillation beam 4 is suppressed, this embodiment provides the effect that a demodulated signal having a high signal-to-noise ratio can be obtained.

Figure 8:
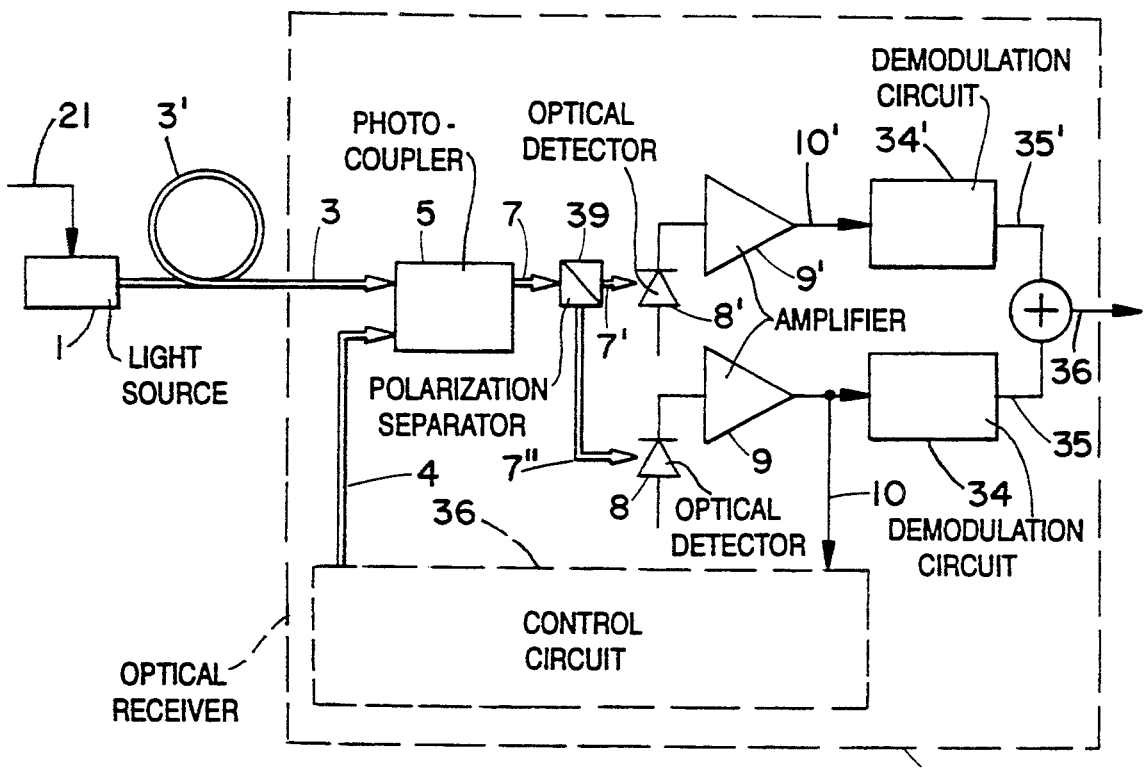
FIG. 8 shows a seventh embodiment of the subject system.

The seventh embodiment will be explained with reference to FIG. 8. FIG. 8 is a structural view of an optical heterodyne or optical homodyne system using a polarization diversity type optical receiver 38. The transmitted optical signal 3 is combined with the local oscillation beam 4 by the photo-coupler 5 and its output beam 7 is separated to beams 7' and 7" having mutually crossing polarization components by a polarization separator such as a polarization prism. These beams are converted to electric signals by the optical detectors 8' and 8, amplified by the amplifiers 9' and 9 and demodulated by the demodulation circuits 34' and 34 to provide the demodulated signals 35' and 35. These demodulated signals 35' and 35 are added to provide a signal 36. The intermediate frequency is stabilized by the control circuit 36 using part 10 of the output of the amplifier 9. Incidentally, this embodiment can be accomplished by inputting part of the output 10' of the amplifier 9' to the control circuit 36.

This embodiment provides the effect that degradation of the signal-to-noise ratio of the demodulated signal due to the polarization fluctuation of the optical signal 3 can be suppressed. The degradation described above can further be suppressed by furnishing a frequency mixer or an envelope detector contained in the demodulation circuit 34' or 34 with the amplitude square characteristics.

Figure 9:
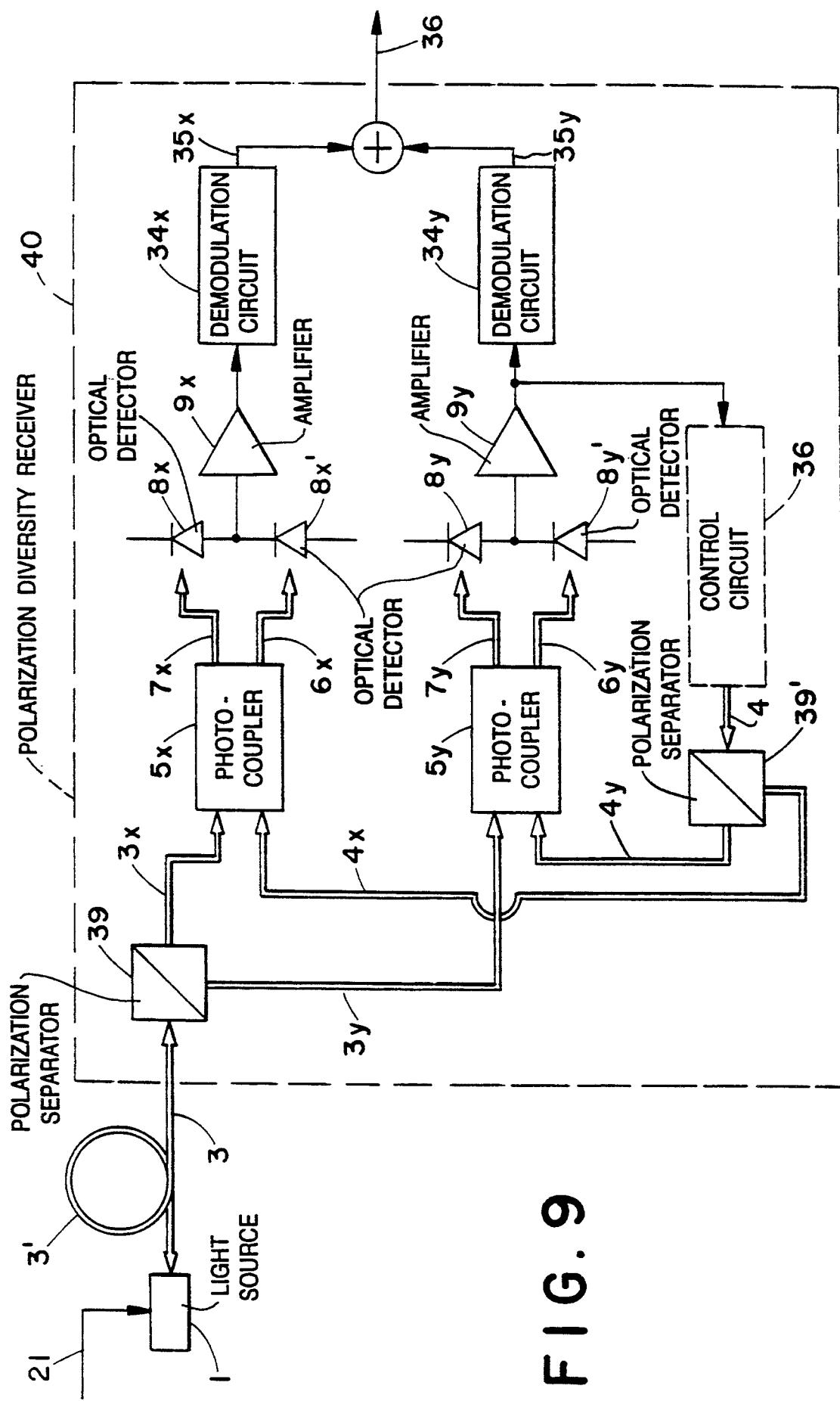
FIG. 9 shows a eighth embodiment of the subject system.

The eighth embodiment will be explained with reference to FIG. 9. FIG. 9 is a structural view of an optical heterodyne or optical homodyne system using a balanced type polarization diversity receiver 40. The signal beam 3 propagating through the optical fiber 3' is separated to an x polarization component beam 3x and a y polarization component beam 3y having substantially crossing polarization directions with each other by the polarization separator 39. Examples of the polarization separator 39 include a polarization prism or a TE-TM polarization separator produced by forming electrodes on an optical waveguide obtained by diffusing ions of Ti or the like in an optical crystal exhibiting birefringence such as $NiNbO_3$. The local oscillation beam 4 is separated into two beams 4x and 4y whose polarization directions are substantially in agreement with 3x and 3y, respectively, by the polarization separator 39', and these beams 4x and 4y are combined with the x polarization component beams y polarization component 3x and 3y by couplers 5x and 5y, respectively.

The method of bringing the polarization directions of the signal beams 3x and 3y into substantial conformity with the local oscillation beams 4x and 4y, respectively, comprises the steps of setting the angle and position of the local oscillator optical source so that the optical power of the output beam 4x is equal to that of the output beam 4y, then observing the detection output of the optical heterodyne (or optical homodyne), that is, the output amplitude of the amplifiers 9x and 9y while keeping this state (the relative position between the polarization beam splitter 39' and the local oscillator optical source 2), and rotating the polarization beam splitter 39 or the combination of the polarization beam splitter 39' with the local oscillator optical source 2 so that the output amplitude becomes maximal. According to this method the polarization directions of the beams 3x and 4x can be brought into substantial conformity with the polarization directions of the beams 4x and 4y, respectively.

Another method of accomplishing the local oscillation beams 4x and 4y comprises inserting a polarization control device into an optical path between the local oscillator optical source 2 and the polarization beam splitter 39' and inserting another polarization control device into the optical paths from the two outputs of the polarization beam splitter 39' to the inputs of the photo-couplers 5x and 5y. In this case, the beam leaving the local oscillator optical source 2 controls the polarization directions so that the output power from the polarization beam splitter 39' is made equal by the polarization control device. Control is effected by the polarization control device so that the polarization directions of the two output beams from the polarization control device 39' are substantially in agreement with the polarization directions of the x polarization beam component 3x and y polarization beam component 3y, respectively. This control method can be realized by observing the detection output of the optical heterodyne (or the optical homodyne), that is, the output amplitudes of the amplifiers 9x and 9y, and setting the polarization beam control device so that the output amplitudes become maximal. An example of the polarization beam control device is an optical fiber whose shape is turned to a circular coil-like form.

The two outputs 7x and 6x (or 7y and 6y) of the two optical couplers 5x and 5y are converted to the electric signals by the two optical detectors 8x and 8x' (or 8y and 8y') but at this time, optical heterodyne (or homodyne) detection occurs. The electric signals are subtracted and amplified by the amplifier 9x (or 9y) and the baseband signal 35x (or 35y) is obtained by the demodulation circuit 34x (or 34y). However, the demodulation circuit 34x is not necessary in the case of the optical homodyne detection.

The demodulation circuit may include a delay detection circuit having a delay device and a multiplier, or an envelope detection circuit having a bandpass filter and an envelope detector.

The outputs 35x and 35y of the demodulation circuits 34x and 34y are added to obtain a signal 36.

This embodiment provides the effects of suppressing the intensity noise contained in the local oscillation beam 4 and of preventing deterioration of the signal-to-noise ratio. Furthermore, this embodiment provides the effect that the degradation of the signal-to-noise ratio of the demodulation signal due to the polarization beam fluctuation of the optical signal 3 can be checked. This degradation can be further suppressed by furnishing the frequency mixer or the envelope detector contained in the demodulation circuit 34 or 34' with the amplitude square characteristics.

The ninth embodiment will be explained with reference to FIG. 10. FIG. 10 shows the optical frequency separation stabilization system of four light sources 1, 2, 1' and 2'. The beams of the light sources 1 and 2 are combined by the photocoupler 5. The optical frequency separation between the light sources 1 and 2 is stabilized by utilizing part 7 of the output beam by the same means as that of the first embodiment. Similarly, the optical frequency separation between the light sources 1' and 2' is stabilized by utilizing part 7' of the combined beam by the same means as that of the first embodiment. The optical frequency separation between these two sets of optical sources (1 and 2) and (1' and 2') is stabilized by combining part 6, 6' of the photo-couplers 5 and 5' by a photo-coupler 5'' and by changing the optical frequency of the light source 1 by utilizing part 7'' of the output beam by the same means as that of the first embodiment. Incidentally, the pass band of the bandpass type amplifier 9'' used thereby includes the optical frequency separation between the light sources 1 and 1'.

Frequency separation stabilization of the four light sources is accomplished by the means described above.

Though the frequency separation is stabilized in this embodiment by use of the first embodiment but it can also be accomplished naturally by use of the second, third or fourth embodiment or their combination.

Though the frequency separation stabilization of the four light sources is made in this embodiment, it is of course possible to make the frequency separation stabilization of n light sources in general in the same way as described above.

Since the optical frequency separation stabilization of a plurality of optical sources is made in accordance with this embodiment, this embodiment provides the effect that the stable optical transmission apparatus 41 can be accomplished.

Besides the same effect as that of the first embodiment, this embodiment provides also the effect that the optical frequency separation between a plurality of light sources can be stabilized.

Figure 11A:
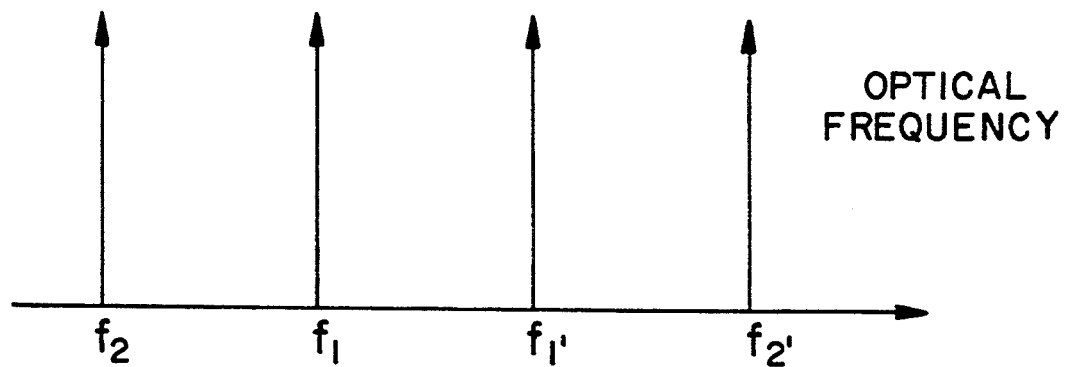
FIGS. 11a–11b show a disposition of the optical frequency of the light sources in a tenth embodiment, on a frequency axis.
Figure 11B:
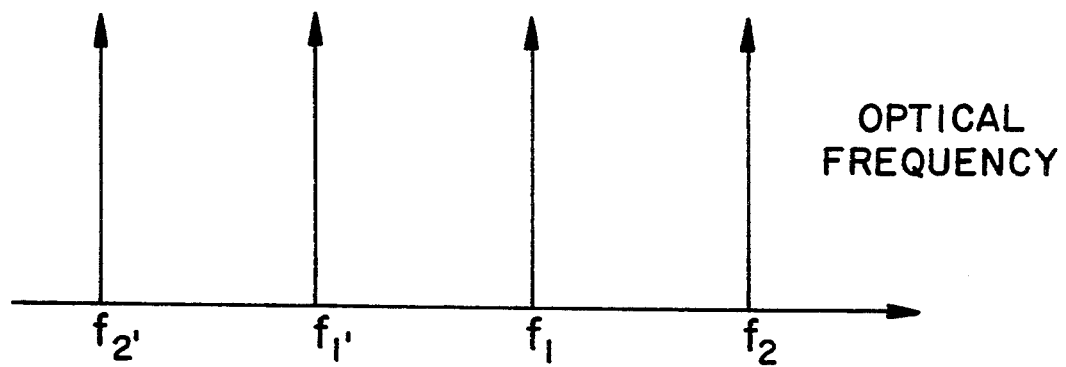

The tenth embodiment will be described with reference to FIGS. 10 and 11. Means for stabilizing the optical frequency separation between a plurality of (four in FIG. 10) light sources is the same as that of the ninth embodiment but this embodiment is characterized in that the disposition of these light sources is set in such a manner that their optical frequencies on the optical frequency axis are adjacent to one another. In the case of FIG. 10, the optical frequencies of the light sources 1, 2, 1' and 2' are arranged as shown in FIG. 11 <a> or <b>. Symbols $f_1$, $f_2$, $f_1'$ and $f_2'$ represent the optical frequencies of the light sources 1, 2, 1' and 2' respectively.

This embodiment provides an effect wherein it is not necessary to broaden the band width of the optical detectors 8, 8' and 8'' and the bandpass filter type amplifiers 9, 9', 9'' shown in FIG. 10.

Figure 13:
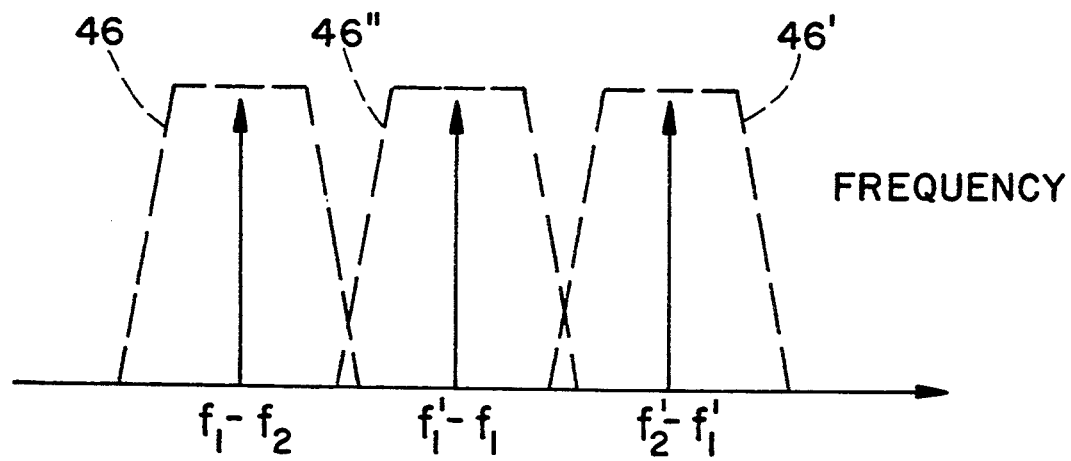
FIG. 13 shows a disposition of the electric signals on the frequency axis in the eleventh embodiment.

The eleventh embodiment will be explained with reference to FIG. 12. This embodiment represents means for keeping constant the optical frequency separation between the four light sources 1, 2, 1' and 2'. The beams 3, 4, 3' and 4' from the four light sources are combined by the optical multiplexers 5, 5', 5'' and part 7'' of its output is converted to the electric signal by the optical detector 8. This electric signal is amplified by the bandpass type amplifier 9. FIG. 13 shows the frequency characteristics of the electric signal described above. In this drawing, $f_1$, $f_2$, $f_1'$ and $f_2'$ represent the optical frequencies of the light sources 1, 2, 1' and 2' respectively. The band 46 of the amplifier 9 is set so as to amplify only $f_2-f_1$. The signal processing from here to the acquisition of the signal 19 is the same as that of the first embodiment. This signal passes through the switch 19, and is added to the driving current of the light source 2 so that the optical frequency separation is stabilized between the light sources 1 and 2 by the same operation as that of the first embodiment.

Here, the amplification band of the bandpass amplifier 9 is switched by the control signal 43 from 46 to 46' in FIG. 13. This can be accomplished by changing the passband of the electronically tunable bandpass filter by the control signal 43.

The output signal of this amplifier 9 contains the frequency component $f_2'-f_1'$. This signal is processed in the same way as in the first embodiment. Here, the output signal 12 of the oscillator 11 is switched by the control signal 44 from $f_s-f_o$ to $f_s'-f_o$. Here, $f_s'$ is the target value of stabilization of the frequency separation between the light sources 1' and 2'. The signal 19 is added to the driving current 20' by switching the switch 100 by the control signal 45 so that the optical frequency separation between the light sources 1' and 2' can be stabilized.

Furthermore, the amplification band of the bandpass amplifier 9 is switched by the control signal 43 from 46' to 46'' in FIG. 13. Accordingly, the output signal of the amplifier 9 contains the frequency component $f_1'-f_1$. This signal is processed in the same way as in the first embodiment. Here, the output signal 12 of the oscillator 11 is switched by the control signal 44 from $f_s'-f_o$ to $f_s''-f_o$. Here, $f_s''$ is the target value of stabilization of the optical frequency separation between the light sources 1 and 1'. The signal 19 is applied to the driving current 20'' by switching the switch 100 by the control signal 45 so that the optical frequency separation between the light sources 1 and 1' can be stabilized.

The optical frequency separation of all the light sources 1, 1', 2 and 2' can be kept constant by sequentially repeating the simultaneous switching operations of the amplification band of the amplifier 9, the oscillation frequency of the oscillator 11 and the switch 100 by the control signals 43, 44, 45. The control signals 43, 44 and 45 are generated by the controller 42.

This embodiment provides the effect that only one system is necessary as the control system 101 in order to keep the optical frequency separations between three or more light sources constant.

Needless to say, besides the first embodiment, the second, third and fourth embodiments may be used as the frequency separation stabilization system in this embodiment.

The twelfth embodiment will be explained with reference to FIGS. 12 and 14. Means for stabilizing the optical frequency separation between a plurality (four in FIG. 12) of light sources is the same as the one used in the eleventh embodiment but the set values $f_s$, $f_s'$ and $f_s''$ of the plurality of optical frequency separation are mutually different as shown in FIG. 14 and this is the characterizing feature of this embodiment. In this drawing, $f_1$, $f_1'$, $f_2$ and $f_2'$ are the optical frequencies of the light sources 1, 1', 2 and 2' respectively.

According to this embodiment, since $f_s$, $f_s'$ and $f_s''$ are all different from one another, two or three frequencies of $f_1-f_2$, $f_2'-f_1'$ and $f_2'-f_1$ do not superpose with one another and there can be obtained the effect that the periodic fluctuation of the optical frequencies due to the frequency stabilization signal can be suppressed.

The thirteenth embodiment will be explained. In FIG. 1, when the signal currents corresponding to two independent digital information signals are superposed with the driving currents 20 and 21, respectively, the beams from the semiconductor lasers 2 and 1 come to possess the optical intensity change or phase change corresponding to the digital information signals. Therefore, an optical transmitter 41' for intensity modulation or frequency modulation can be accomplished by causing part 6 of the output of the optical multiplexer 5 to be incident into a transmission optical fiber. This embodiment provides such an optical transmitter.

In this embodiment, the light source may be other lasers, multi-electrode semiconductor lasers, the combination of the semiconductor laser with the optical system and the mirror, the optical fiber or diffraction grating shown in FIG. 4, and so forth. Stabilization by temperature shown in FIG. 6 may be used as means for stabilizing the frequency separation. Another example of this embodiment is represented by 41 in FIG. 10. Reference numeral 41" in FIG. 12 represents still another example.

This embodiment provides an optical transmission apparatus for wavelength multiplexing or frequency multiplexing with stabilized frequency separation.

The fourteenth embodiment will be explained with reference to FIG. 15. Reference numeral 41 in this drawing represents the transmission apparatus described in the thirteenth embodiment. The output beam 6 of this optical transmission apparatus 41 passes through the optical fiber 47, and is separated to a beam of each wavelength by the optical multi/demultiplexer 48 and its optical output 50 is received by the optical receiver 49. The optical output 50 of the optical multiplexer/demultiplexer 48 is one of the (or optical frequency) transmitted by transmission apparatus 41. The optical multi/demultiplexer produces a number of outputs corresponding to the number of the wavelengths (or frequencies) to be multiplexed which are transmitted from the optical transmission apparatus and in this case, one each optical receiver 49 is necessary for each output. (See FIG. 16 where two receivers are required.)

The optical signal in this embodiment is the intensity-modulated beam and the optical receiver 49 is a direct detection optical receiver consisting of at least the optical detector 51 and an amplifier.

This embodiment provides a wavelength multiplexing or optical frequency multiplexing communication system and a communication apparatus with stabilized optical frequency separation.

Figure 12:
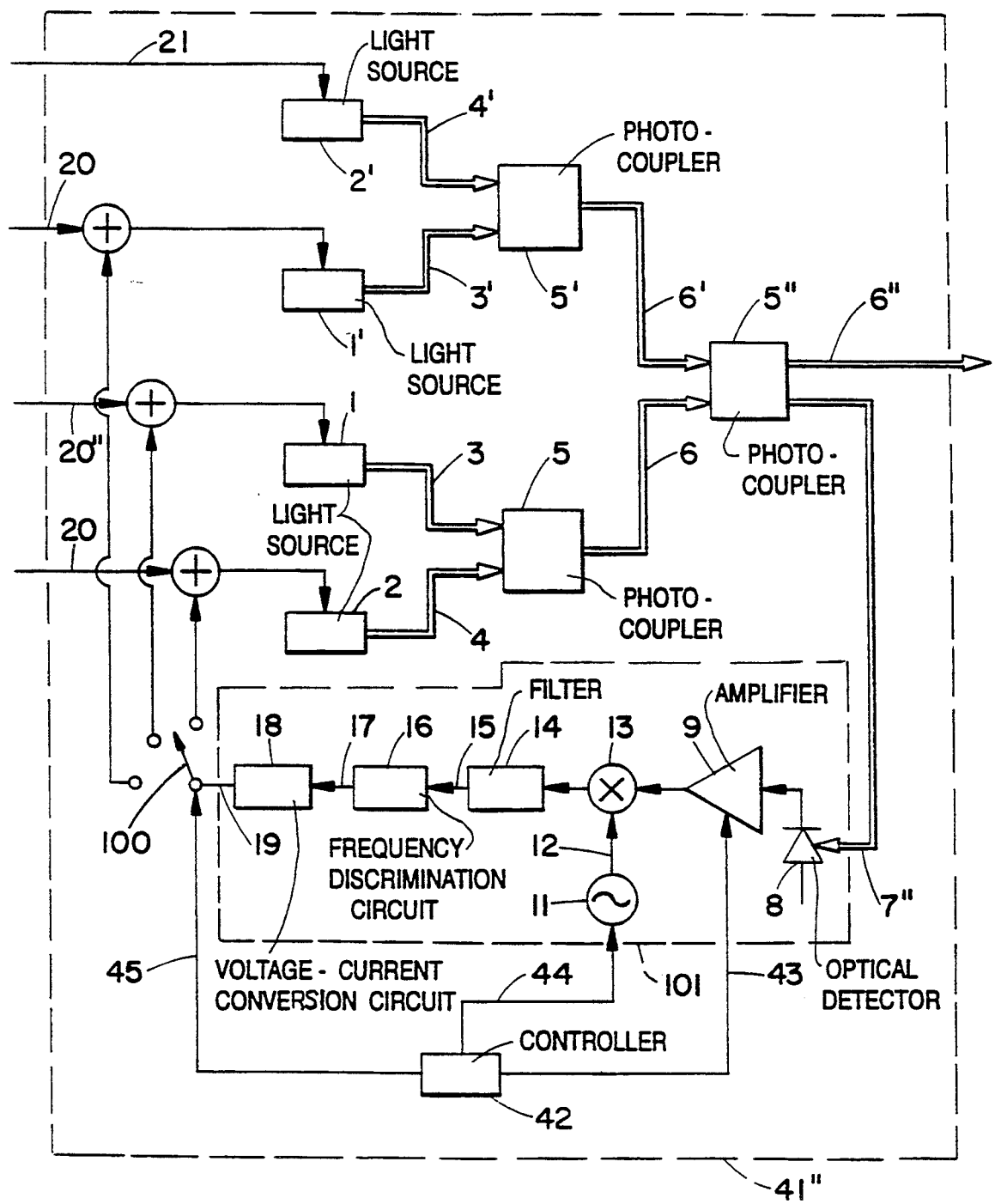
FIG. 12 shows structures of tenth, and eleventh and twelfth embodiments.

Incidentally, other optical transmitters such as 41' in FIG. 1 or 41" in FIG. 12 may be used as the optical transmitter in FIG. 15.

The fifteenth embodiment will be explained with reference to FIG. 17. The beam 6 from the transmitter 41 of the thirteenth embodiment passes through the optical fiber 47 and the optical output 54 is combined with the beam 55 from the local oscillator optical source 56 by the photo-coupler 53. The output 57 of the photo-coupler 53 is subjected to optical heterodyne or optical homodyne detection by the optical detector 58 and the intermediate frequency signal is amplified by the amplifier 59 and converted to the baseband signal by the demodulation circuit 34. In this manner an arbitrary signal from the frequency-multiplexed beams from the transmitter 41 can be received by the optical heterodyne or optical homodyne receiver 60. Incidentally, the optical signal of this embodiment is the frequency-modulated or phase-modulated beam.

This embodiment provides a wavelength multiplexing or optical frequency multiplexing communication system and communication apparatus with stabilized optical frequency separation.

Incidentally, other optical transmitters such as 41' in FIG. 1 or 41" in FIG. 12 may be used as the optical transmitter in FIG. 17.

The sixteenth embodiment will be explained with reference to FIG. 18. This embodiment is characterized in that a balanced type receiver 61 is used in place of the optical heterodyne or optical homodyne receiver 60 of the fifteenth embodiment. This embodiment relates to the combined system of the transmitter 41 and the receiver 60 and its transmission apparatus. The structure and operation principle of the balanced type receiver are explained in the sixth embodiment.

Incidentally, other optical transmitters such as 41' in FIG. 1 or 41" in FIG. 12 may be used as the optical transmitter of this embodiment.

Since the intensity noise of the local oscillation beam 55 is suppressed, this embodiment provides a system capable of obtaining a demodulated signal having a high signal-to-noise ratio, and a transmission apparatus for the system.

Figure 19:
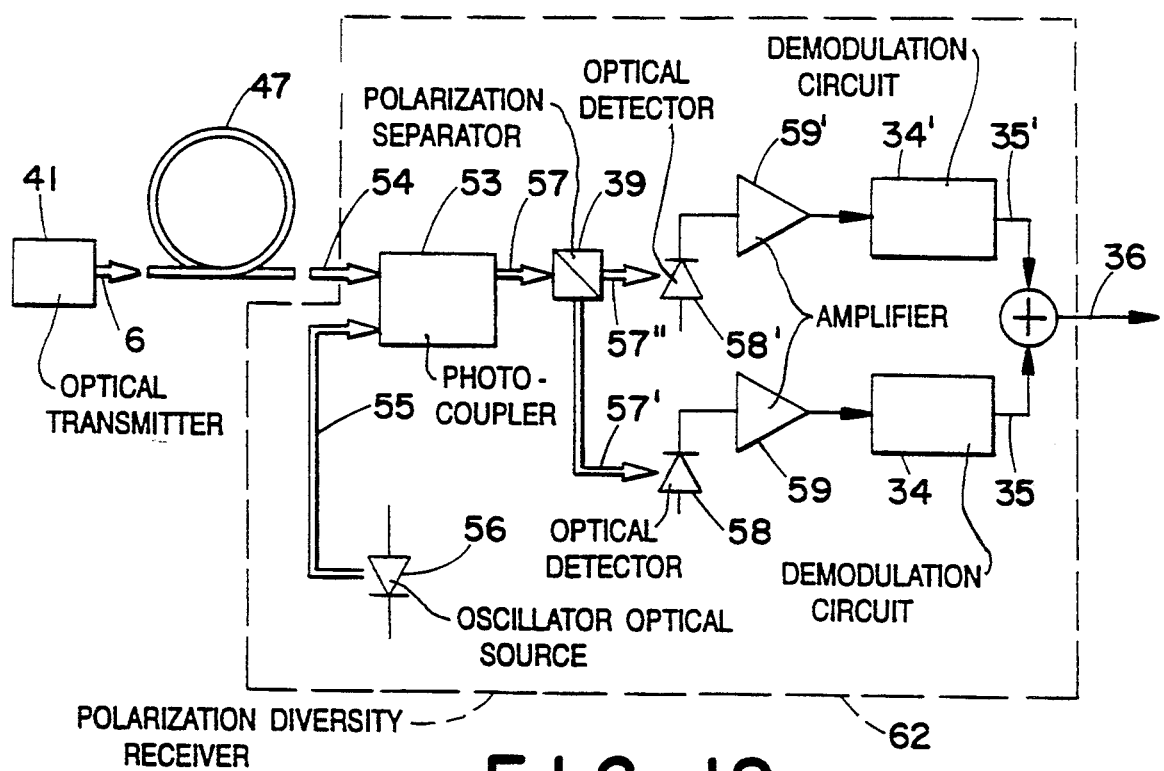
FIG. 19 shows a seventeenth embodiment of the subject system.

The seventeenth embodiment will be explained with reference to FIG. 19. This embodiment uses a polarization diversity receiver 62 as the optical heterodyne or homodyne receiver 62. The structure and operation principle of the polarization diversity receiver are explained already with reference to the seventh embodiment. This embodiment relates to the combined system of the transmitter 41 with the receiver 61 and its transmission apparatus. Incidentally, other optical transmitters such as 41' in FIG. 1 or 41" in FIG. 12 may be used as the optical transmitter of this embodiment.

This embodiment effectively prevents degradation of the signal-to-noise ratio of the demodulated signal 36 due to polarization fluctuation of the optical fiber output 54. Furthermore, the embodiment provides a communication system and its transmission apparatus capable of further suppressing the degradation of signal to noise ratio by furnishing the frequency mixers or the envelope detectors contained in the demodulation circuits 34 and 34' with the amplitude square characteristics.

Figure 20:
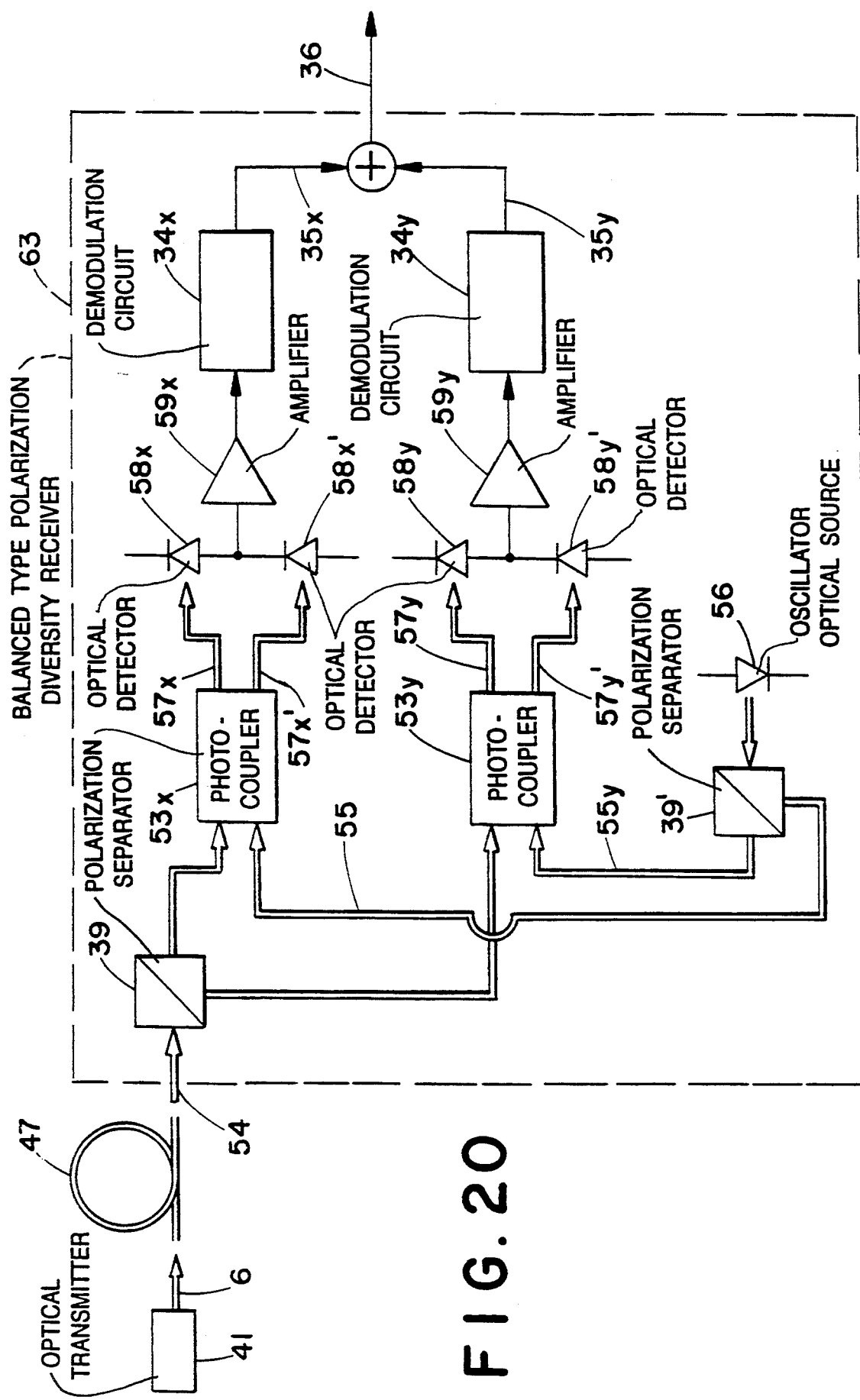
FIG. 20 shows an eighteenth embodiment of the subject system.

The eighteenth embodiment will be explained with reference to FIG. 20. This embodiment uses a balanced type polarization diversity receiver 63 as the optical heterodyne or homodyne receiver. The structure and operation principle of the balanced type polarization diversity receiver are explained already in the eighth embodiment. This embodiment relates to the combined system of the optical transmitter 41 and the receiver 63 and its transmission apparatus.

Incidentally, the optical transmitter of this embodiment may be other optical transmitters such as 41' in FIG. 1 or 41" in FIG. 12.

This embodiment provides the effect that the intensity noise contained in the beam from the local oscillator optical source 56 is extinguished and degradation of the signal-to-noise ratio can be prevented. Furthermore, the embodiment provides the effect that degradation of the signal-to-noise ratio of the demodulated signal due to the polarization fluctuation of the optical signal 54 can be suppressed. Still further, the embodiment provides the effect that the degradation can further be suppressed by furnishing the frequency mixer or the envelope detectors contained in the demodulation circuit 34x or 34y with the amplitude square characteristics.

Figure 21:
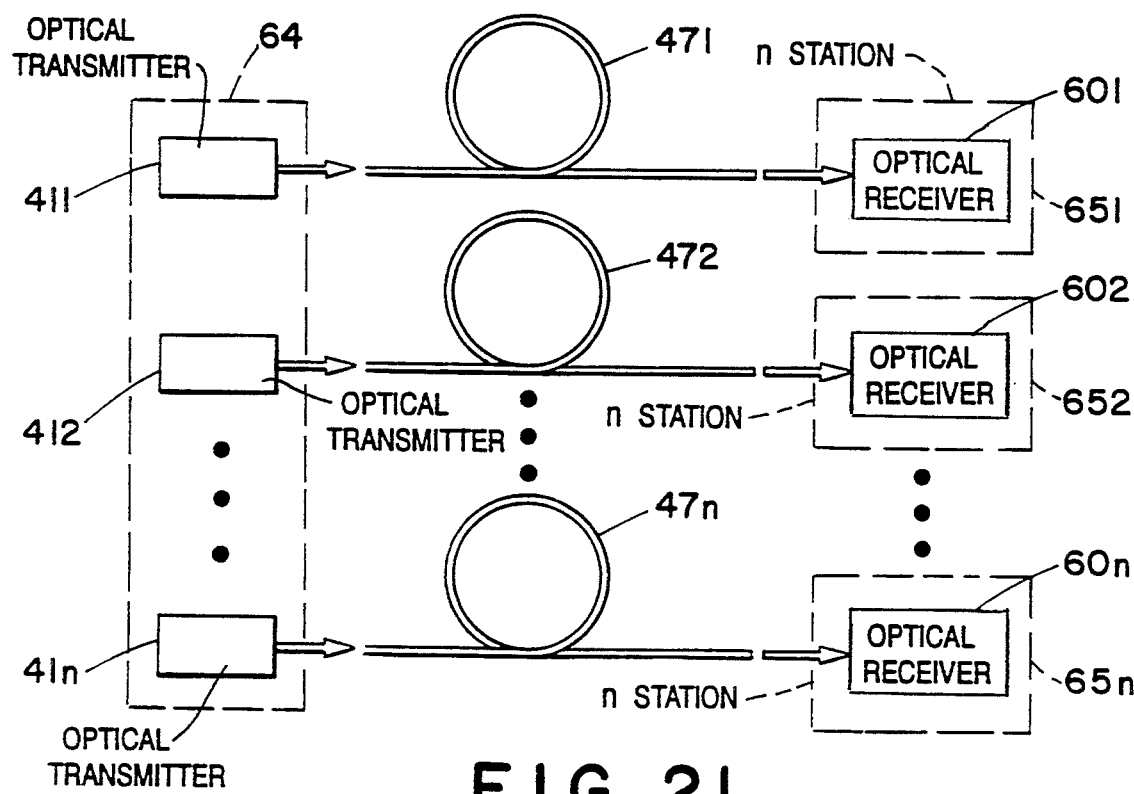
FIG. 21 shows a nineteenth embodiment of the subject system.

The nineteenth embodiment will be explained with reference to FIG. 21. In FIG. 21, n optical fibers 471, 472, ..., 47n are shown extended from a center station 64 to n stations 651, 652, ..., 65n. The center station 64 stores n optical transmitters 411, 412, ..., 41n and these optical transmitters are the aforementioned transmitters 41, 41' or 41''. At least one optical receiver 601, 602, ..., 60n exists in other station 651, 652, ..., 65n and these optical receivers are the aforementioned optical receiver 49, 60, 61, 62 or 63.

In this embodiment, the wavelength-multiplexed or frequency-multiplexed beams are transmitted from the center station 64 to the other stations 651, 652, ..., 65n and the other stations 651, 652, ..., 65n receive the information by any of direct detection, optical heterodyne detection and optical homodyne detection. This embodiment relates to this system and an apparatus for practicing the system.

Needless to say, subscribers may substitute the other stations 651, 652, ..., 65n in this embodiment. A two-way communication system can of course be accomplished by disposing the optical transmitter in at least one of the other stations 651, 652, ..., 65n so as to transmit the optical signal from the other station to the center station 64 and to receive it by the optical receiver installed in the center station.

This embodiment provides the effect that a one-way or two-way optical communication network having stable optical frequency separation and high transmission quality can be configured.

In accordance with the present invention, the optical frequency separation can be stabilized without using the optical etalon or the like so that an optical frequency stabilization system which is stable for a long period can be accomplished.

Since optical frequency stabilization is made by utilizing part of the photo-coupler in accordance with the present invention, the beam from the light source can be utilized effectively. In practice, only ½ of the photo-coupler output has been utilized conventionally in the wavelength multiplexing or optical frequency multiplexing system, but this embodiment can utilize all the photo-coupler output.

Having thus described the invention, it is now claimed:

1. An apparatus for stabilizing a frequency separation between two light sources, comprising:
    a multiplexer forming a combined beam from output beams of two light sources;
    an optical detector converting part of the combined beam to a first electric signal having a frequency separation between the light sources;
    an oscillator generating a second electric signal having a reference frequency;
    a multiplier forming a multiplied signal from the first and second electric signals; and
    means for adding a control current obtained from the multiplied signal to at least one of driving currents of the light sources so as to stabilize a desired frequency separation between the output beams of the light sources.

2. An apparatus for stabilizing a frequency separation according to claim 1, wherein the light sources are semiconductor lasers or multi-electrode lasers.

3. An apparatus for stabilizing a frequency separation according to claim 1, wherein the adding means includes a frequency discrimination circuit comprising a delay circuit delaying the multiplied signal and a double balance mixer mixing the delayed signal with the multiplied signal.

4. An apparatus for stabilizing a frequency separation between two light sources, comprising:
    a multiplexer forming a combined beam from output beams of two light sources, at least one of said light sources comprises a combination of a semiconductor laser device and a mirror separated by a lens system;
    an optical detector converting part of the combined beam to a first electric signal having a frequency separation between the light sources;
    an oscillator generating a second electric signal having a reference frequency;
    a multiplier forming a multiplied signal from the first and second electric signals;
    means for adding a control signal obtained from the multiplied signal to at least one of the light sources so as to varying a separation between the semiconductor laser device and the mirror.

5. An apparatus for stabilizing a frequency separation between two light sources, comprising:
    a multiplexer forming a combined beam from output beams of two light sources, at least one of said light sources comprises a combination of a semiconductor laser device and an optical fiber;
    an optical detector converting part of the combined beam to a first electric signal having a frequency separation between the light sources;
    an oscillator generating a second electric signal having a reference frequency;
    a multiplier forming a multiplied signal from the first and second electric signals;
    means for adding a control signal obtained from the multiplied signal to at least one of the light sources so as to varying a separation between the semiconductor laser device and the optical fiber.

6. An apparatus for stabilizing a frequency separation between two light sources, comprising:
    a multiplexer forming a combined beam from output beams of two light sources, at least one of said light sources comprises a combination of a semiconductor laser device and a diffraction grating separated by a lens system;
    an optical detector converting part of the combined beam to a first electric signal having a frequency separation between the light sources;
    an oscillator generating a second electric signal having a reference frequency;
    a multiplier forming a multiplied signal from the first and second electric signals;
    means for adding a control signal obtained from the multiplied signal to at least one of the light sources so as to varying a separation between the semiconductor laser device and the diffraction grating.

7. An apparatus for stabilizing a frequency separation between two light sources, comprising:
    a multiplexer forming a combined beam from output beams of two light sources, at least one of the light sources having a variable temperature device receiving a control signal from an associated controlling means;
    an optical detector converting part of the combined beam to a first electric signal having a frequency separation between the light sources;

an oscillator generating a second electric signal having a reference frequency;
a multiplier forming a multiplied signal from the first and second electric signals;
means for adding a control signal obtained from the multiplied signal to the variable temperature device.

8. An apparatus for stabilizing a frequency separation between two light sources according to claim 7, wherein the variable temperature device is a Peltier device.

9. A method of stabilizing a frequency separation between two light sources, comprising the steps of:
combining output beams from two light sources;
converting part of the combined beam to a first electric signal having a frequency separation between the light sources;
generating a second electric signal having a reference frequency;
multiplying the first electric signal and the second electric signal;
adding a control current obtained from the multiplied signal to at least one of driving currents of the light sources so as to stabilize a desired frequency separation between the output beams of the light sources.

10. An optical communication system comprising:
a photo-coupler forming a combined optical signal with a first optical signal from a transmission line and a second optical signal from a local oscillation light source;
an optical detector forming a first electric signal having a frequency separation between the first and second optical signals; and
a control circuit including an oscillator generating a second electric signal having a reference frequency, for adding a control current obtained from a multiplied signal formed with the first and second electric signals to a driving current of the local oscillation light source so as to stabilize a desired frequency separation between the first and second optical signals.

11. A balanced type communication system comprising:
a photo-coupler forming a combined optical signal with a first optical signal from a transmission line and a second optical signal from a local oscillation light source;
two optical detectors detecting the combined optical signal to form a first electric signal having a frequency separation between the first and second optical signals; and
a control circuit including an oscillator generating a second electric signal having a reference frequency and a multiplier forming a multiplied signal from the first and second electric signals, for adding a control current obtained from the multiplied signal to a driving current of the local oscillation light source so as to stabilize a desired frequency separation between the first and second optical signals.

12. A polarization diversity optical communication system comprising:
a photo-coupler forming a combined optical signal with a first optical signal from a transmission line and a second optical signal from a local oscillation light source;
a polarization beam splitter splitting the combined optical signal into crossing two polarization components;
two optical detectors, each detecting the corresponding polarization component to form a first electric signal having a frequency separation between the first and second optical signals;
two demodulation circuits, each demodulating the first electric signal;
an adder adding the demodulated signals; and
a control circuit including an oscillator generating a second electric signal having a reference frequency and a multiplier forming a multiplied signal from the first and second electric signals, for adding a control current obtained from the multiplied signal to a driving current of the local oscillation light source so as to stabilize a desired frequency separation between the first and second optical signals.

13. A balanced type polarization diversity optical communication system comprising:
a first polarization separator separating a first optical signal form a transmission line into first x and y polarization components;
a second polarization separator separating a second optical signal from a local oscillation light source into second x and y polarization components;
a first photo-coupler forming a first combined optical signal with the first x polarization component from the first polarization separator and a second x polarization component from the second polarization separator;
two first optical detectors detecting the x polarization optical signal to form a first electric signal having a frequency separation between the first and second optical signals;
a second photo-coupler forming a second combined optical signal with the first y polarization component from the first polarization separator and a second y polarization component from the second polarization separator;
two second optical detectors detecting the combined y polarization optical signal to form a second electric signal having a frequency separation between the first and second optical signals;
first and second receivers receiving the combined x polarization optical signal and the combined y polarization optical signal, respectively;
means for adding outputs of the first and second receivers; and
a control circuit including an oscillator generating a third electric signal having a reference frequency and a multiplier forming a multiplied signal from the third electric signal and one of the first and second electric signals, for adding a control current obtained from the multiplied signal to a driving current of the local oscillation light source so as to stabilize a desired frequency separation between the first and second optical signals.

14. An optical transmitter comprising:
a multiplexer forming a combined beam from output beams of two light sources, each having a driving current superposed with a signal current corresponding to an independent digital information signal;
an optical detector converting part of the combined beam to a first electric signal having a frequency separation between the light sources;

an oscillator generating a second electric signal having a reference frequency;

a multiplier forming a multiplied signal from the first and second electric signals; and means for adding a control current obtained from the multiplied signal to at least one of driving currents of the light sources so as to stabilize a desired frequency separation between the output beams of the light sources.

15. An optical communication system for wave length multiplexing or frequency multiplexing with stabilized frequency separation, comprising:

an optical transmitter comprising, a multiplexer forming a combined beam from output beams of two light sources, each having a driving current superposed with a signal current corresponding to an independent digital information signal, an optical detector converting part of the combined beam to a first electric signal having a frequency separation between the light sources, an oscillator generating a second electric signal having a reference frequency, a multiplier forming a multiplied signal from the first and second electric signals, and means for adding a control current obtained from the multiplied signal to at least one of driving currents of the light sources so as to stabilize a desired frequency separation between the output beams of the light sources;

an optical transmission line transmitting the combined beam;

an optical demultiplexer separating the combined beam into two beams, a frequency of one of the beams is different from that of the other beam; and an optical receiver having an optical detector and an amplifier, for outputting a received signal obtained from one of the beams to demodulate a signal.

16. An optical communication system for wave length multiplexing or frequency multiplexing with stabilized frequency separation, comprising:

an optical transmitter comprising, a multiplexer forming a combined beam from output beams of two light sources, each having a driving current superposed with a signal current corresponding to an independent digital information signal, an optical detector converting part of the combined beam to a first electric signal having a frequency separation between the light sources, an oscillator generating a second electric signal having a reference frequency, a multiplier forming a multiplied signal from the first and second electric signals, and means for adding a control current obtained from the multiplied signal to at least one of driving currents of the light sources so as to stabilize a desired frequency separation between the output beams of the light sources;

an optical transmission line transmitting an output beam from the optical transmitter; and an optical heterodyne or homodyne receiver comprising a local oscillator optical source, a photo-coupler combining a transmitted beam from the optical transmission line and a local beam from the local oscillator optical source, an optical detector detecting an output from the photo-coupler as an optical signal having an intermediate frequency signal, and a demodulation circuit converting the electric signal to a baseband signal.

* * * * *